(12) United States Patent  
Sato et al.

(10) Patent No.: US 6,193,803 B1
(45) Date of Patent: Feb. 27, 2001

(54) SUBSTRATE HOLDING APPARATUS FOR PROCESSING SEMICONDUCTORS

(75) Inventors: Kiyoshi Sato; Mikio Shimizu; Yukihiro Mori, all of Tama (JP)

(73) Assignee: ASM Japan K.K., Tokyo (JP)

( * ) Notice: Subject to any disclaimer, the term of this patent is extended or adjusted under 35 U.S.C. 154(b) by 0 days.

(21) Appl. No.: 09/213,582

(22) Filed: Dec. 17, 1998

(30) Foreign Application Priority Data

Dec. 19, 1997 (JP) .................................................. 9-364319

(51) Int. Cl.[7] .................................................. C23C 16/00
(52) U.S. Cl. .................................................. 118/728
(58) Field of Search .................................. 118/715, 724, 118/725, 728; 156/345

(56) References Cited

U.S. PATENT DOCUMENTS 5,558,717 * 9/1996 Zhao et al. ........................... 118/715
5,968,273 * 10/1999 Kadomura et al. .................. 118/715
6,024,827 * 10/1999 Ishii .................................... 156/345

* cited by examiner

Primary Examiner—Richard Bueker
Assistant Examiner—Erin Fieler
(74) Attorney, Agent, or Firm—Knobbe, Martens, Olson & Bear, LLP

(57) ABSTRACT

A substrate-holding apparatus for holding a semiconductor substrate in a semiconductor processor is characterized in that the apparatus includes a mount block made of an aluminum alloy wrought product and having a mount surface for mounting a semiconductor thereon, a heating block with a heater body embedded therein for heating the semiconductor substrate, and a shield member made of an aluminum alloy wrought product for housing the heating block. The mount plate is securely attached to the heating block by brazing or with bolts.

17 Claims, 7 Drawing Sheets

SUBSTRATE HOLDING APPARATUS FOR PROCESSING SEMICONDUCTORS

BACKGROUND OF THE INVENTION

1. Field of the Invention

The present invention relates to a semiconductor holding apparatus for holding a semiconductor substrate in semiconductor processing equipment and, more particularly, to a structure of a susceptor for holding a substrate in plasma CVD equipment.

2. Description of the Related Art

Plasma CVD equipment is commonly used for exciting a particular source gas in an evacuated reaction chamber using high-frequency plasma to deposit a thin film on a semiconductor substrate. Reaction products similar to those on the surface of a semiconductor wafer are deposited on the inner wall of the reaction chamber of such plasma CVD equipment. It is therefore necessary to perform plasma etching periodically using a gas including fluorine atoms to eliminate the reaction products for cleaning in order to prevent contamination of a semiconductor wafer. In doing this, a susceptor is required above all to be resistant to fluorine so that it does not react with fluorine active species to generate a contaminant. Since it is also required to heat a semiconductor substrate rapidly to a predetermined temperature, high thermal conductivity is also required.

Anodized susceptors made of aluminum or aluminum alloy incorporating a high-frequency electrode have been widely used as substrate holding apparatuses for holding a substrate in plasma CVD equipment. However, a problem has existed in that the surface of an anodized susceptor is liable to cracks in a plasmatic environment at 400° C. and in that fluorine active species penetrate into the cracks to corrode aluminum inside.

Under such circumstances, susceptor devices such as that disclosed in U.S. Pat. No. 5,558,717 have been developed which have a structure wherein a mount plate made of aluminum nitride for mounting a semiconductor substrate is put in contact with an upper surface of a heating block made of high purity aluminum with a nichrome wire embedded therein. Such conventional susceptors were developed to take advantage of the fact that ceramic materials such as aluminum nitride are resistant to fluorine based active species and are excellent in thermal conductivity.

However, such conventional susceptors face a difficulty in mechanically attaching and fixing their components due to distortions attributable to the fact that two types of materials, i.e., aluminum nitride and high purity aluminum, having significantly different thermal expansion coefficients are put in contact with each other. As a result, a problem arises in that there will be imperfect contact regions into which active species of fluorine can penetrate to corrode the top surface of the heating block, thereby generating a contaminant.

Further, the part of the heating block of such conventional susceptors can react with fluorine active species to generate a contaminant because it is made of aluminum.

Since the susceptors also serve as high-frequency electrodes, such imperfect contact can produce a parasitic capacity which can adversely affect the distribution of high-frequency discharge.

Furthermore, the conventional susceptors have a problem in that their manufacturing cost is high and the operating cost of an apparatus is therefore increased.

It is therefore an object of the invention to provide a substrate holding apparatus having a mount surface which is highly resistant to fluorine based active species and free from the risk of contamination by impurities.

It is another object of the invention to attach a mount plate and a heating block to each other with perfect tightness to eliminate any gap through which fluorine active species can enter, thereby improving resistance to fluorine and improving thermal conductivity to improve process stability.

It is still another object of the invention to shield a heating block from fluorine active species completely, thereby improving the resistance of a substrate holding apparatus as a whole to fluorine active species.

It is a further object of the invention to provide a substrate holding apparatus at a low cost, thereby reducing the apparatus operating cost.

SUMMARY OF THE INVENTION

In order to achieve the above-mentioned objects, a substrate holding apparatus according to the invention comprises means as described below.

A substrate holding apparatus according to the invention for holding a semiconductor substrate inside a semiconductor processing equipment comprises:

a mount plate made of an aluminum alloy wrought products and having a mount surface for use in mounting the semiconductor substrate thereon;

a heating block with a heater body being embedded therein for heating the semiconductor substrate; and a shield member made of an aluminum alloy wrought products for use in housing therein the heating block, wherein the top surface of the heating block is tightly attached to the bottom surface of the mount plate.

The heating block is preferably made of aluminum alloy.

The tight attachment is specifically achieved by brazing the bottom surface of the mount plate and the top surface of the heating block.

The tight attachment is also achieved by fixing the mount plate and the heating block together at least one bolt.

Alternatively, a substrate holding apparatus according to the invention for holding a semiconductor substrate inside a semiconductor processing equipment comprises:

a mount plate made of an aluminum alloy wrought products and having a mount surface for use in mounting the semiconductor substrate thereon;

a heating block with a heater body embedded therein for heating the semiconductor substrate;

an auxiliary plate made of an aluminum alloy wrought products, the auxiliary plate being inserted between the mount plate and the heating block; and a shield member made of an aluminum alloy wrought products for use in housing therein the heating block, wherein the top surface and bottom surface of the auxiliary plate are tightly attached to the bottom surface of the mount plate and the top surface of the heating block, respectively.

Preferably, the heating block is made of aluminum alloy.

The tight attachment between the top surface of the auxiliary plate and the bottom surface of the mount plate is specifically achieved by fixing the auxiliary plate and the mount plate together by using at least one bolt.

The tight attachment between the bottom surface of the auxiliary plate and the top surface of the heating block is specifically achieved by brazing together the bottom surface of the auxiliary plate and the top surface of the heating block.

Further alternatively, a substrate holding apparatus according to the invention for holding a semiconductor substrate in semiconductor processing equipment comprises:
  a mount plate made of a ceramic material and having a mount surface for use in mounting the semiconductor substrate thereon;
  a heating block with a heater body embedded therein for heating the semiconductor substrate;
  an auxiliary plate made of an aluminum alloy wrought products, the auxiliary plate being inserted between the mount plate and the heating block; and
  a shield member made of an aluminum alloy wrought products for housing therein the heating block,
  wherein the top surface and bottom surface of the auxiliary plate are tightly attached to the bottom surface of the mount plate and the top surface of the heating block, respectively.

The ceramic material is specifically any of aluminum nitride, alumina or magnesium oxide.

The tight attachment between the top surface of the auxiliary plate and the bottom surface of the mount plate is specifically achieved by fixing together the auxiliary plate and the mount plate using at least with one bolt.

The tight attachment between the bottom surface of the auxiliary plate and the top surface of the heating block is specifically achieved by brazing together the bottom surface of the auxiliary plate and the top surface of the heating block.

DETAILED DESCRIPTION OF PREFERRED EMBODIMENTS

The present invention will now be described with reference to the drawings.

Figure 1:
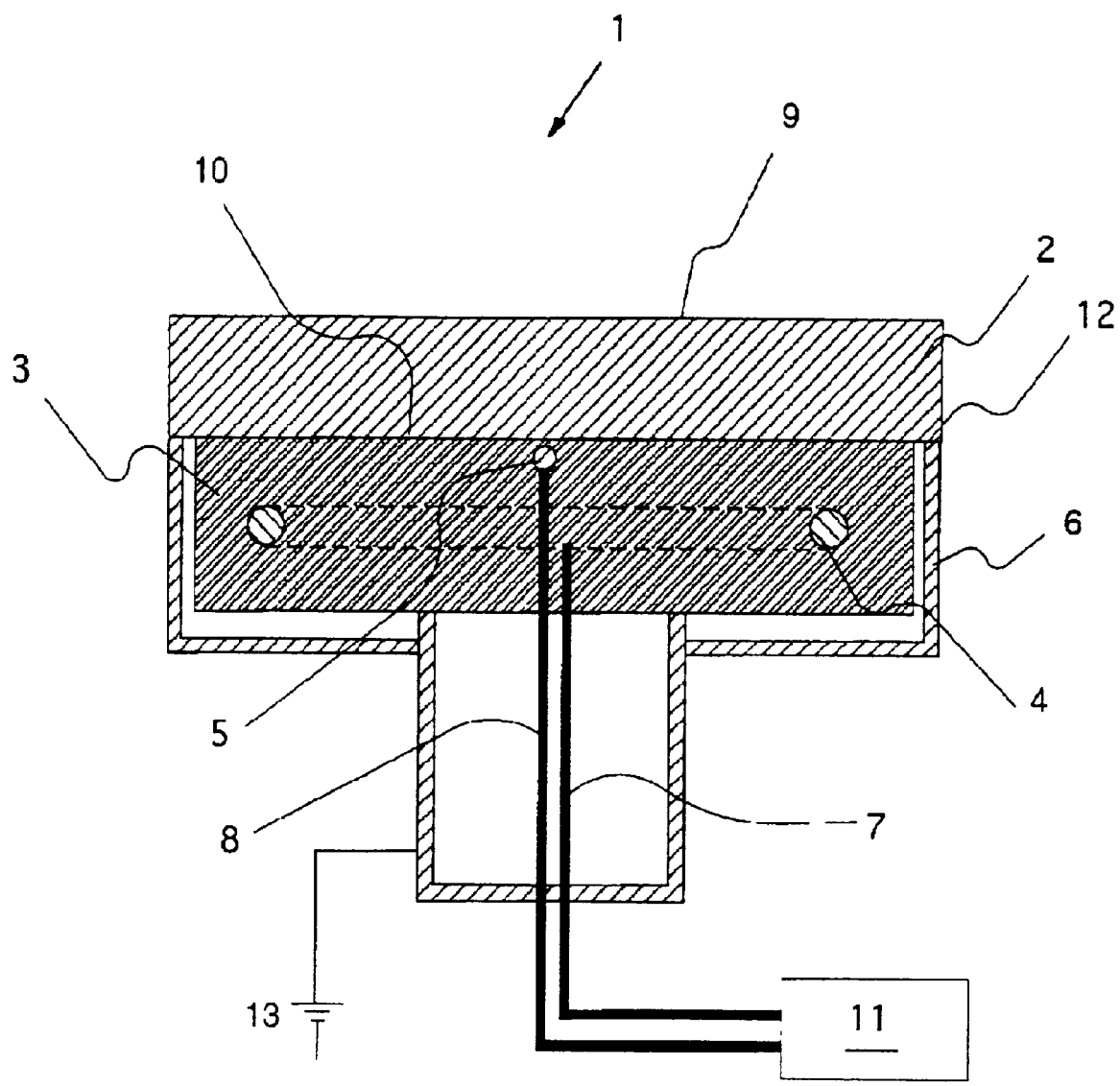
FIG. 1 is a sectional view of a preferred embodiment of a substrate holding apparatus according to the present invention.
Figure 2:
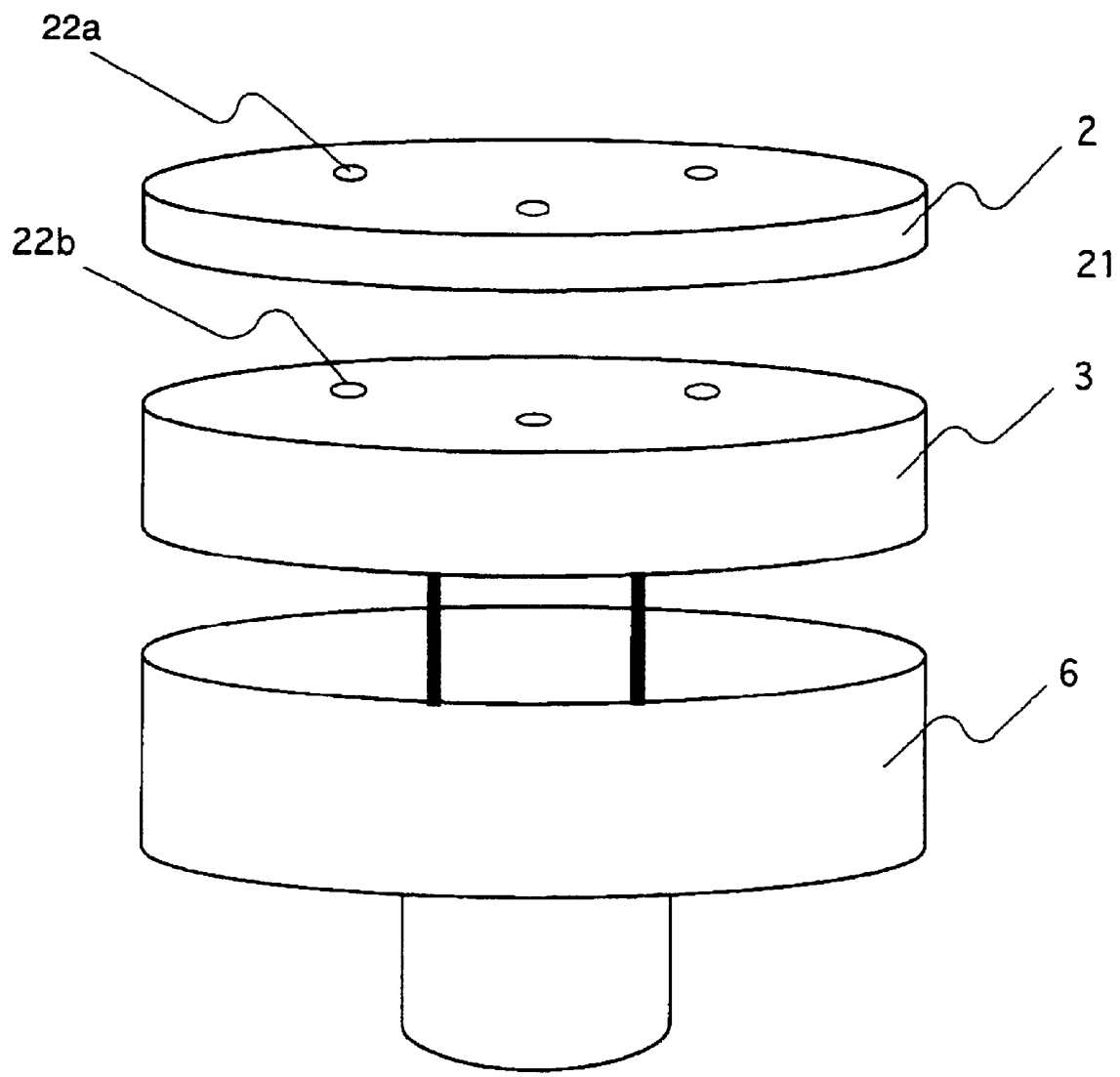
FIG. 2 is an exploded perspective view of the substrate holding apparatus in FIG. 1.

FIG. 1 schematically shows a sectional view of a preferred embodiment of a substrate holding apparatus according to the present invention, and FIG. 2 schematically shows an exploded perspective view of the preferred embodiment.

A substrate holding apparatus 1 according to the present invention comprises a mount plate 2 made of an aluminum wrought products having a mount surface 9 for use in mounting a semiconductor substrate thereon, a heating block 3 with a heater body 4 embedded therein for heating the semiconductor substrate and a shield member 6 made of an aluminum wrought products for housing the heating block 3 therein.

Preferably, the mount plate 2 is a disc-shaped body made of an aluminum wrought products having a radius in the range from 50 mm to 180 mm and a thickness in the range from 5 mm to 15 mm, and the heating block 3 is a cylindrical body made of aluminum alloy having a radius in the range from 50 mm to 180 mm and a thickness in the range from 40 mm to 100 mm. One of the features of the invention is that the mount plate 2 and the shield member 6 are made of an aluminum wrought products. The mount surface 9 of the mount plate 2 made of an aluminum wrought products exhibits high resistance to fluorine active species because it has a very dense organization and has nocrystal defect. In order to ensure high thermal conductivity, the mount plate 2 is brazed to the heating block 3 on its bonding surface 10 to be completely attached thereto.

A temperature sensor 5 is provided inside the heating block 3 to detect the process temperature of a semiconductor substrate. The temperature sensor 5 is preferably a thermocouple. A signal indicative of the temperature detected by the temperature sensor 5 is transmitted to a PID temperature controller 11 through a lead wire 8, and the PID temperature controller 11 controls the power to the heater body 4 through a lead wire 7. The heater body 4, temperature sensor 5 and lead wires 7 and 8 are preferably contained in sheaths made of stainless steel and are embedded in the heating block 3 through a casting process. Nickel based alloys such as inconel 600 (76Ni-15.5Cr-8Fe mass %) or other metals having high anti-corrosion properties may be used as a sheath material. While the heater body 4 is preferably constituted by a nichrome wire and is contained in the sheath together with magnesium oxide for insulation, other heat-generating resistors may be used.

Preferably, the shield member 6 is a cylindrical member made of an aluminum wrought products and is comprised of a part for containing the heating block 3 and a part for supporting the heating block 3 in a reaction chamber. An open end 12 of the shield member 6 is preferably welded to the circumferential edge of the bottom of the mount plate 2 using electron beams. Thus, the heating block 3 is contained in the shield member 6. The mount plate 2 is connected to the earth 13 through the shield member 6.

Preferably, through holes 22a and 22b for inserting hold rods for picking up a semiconductor wafer are provided in three locations each.

Figure 3:
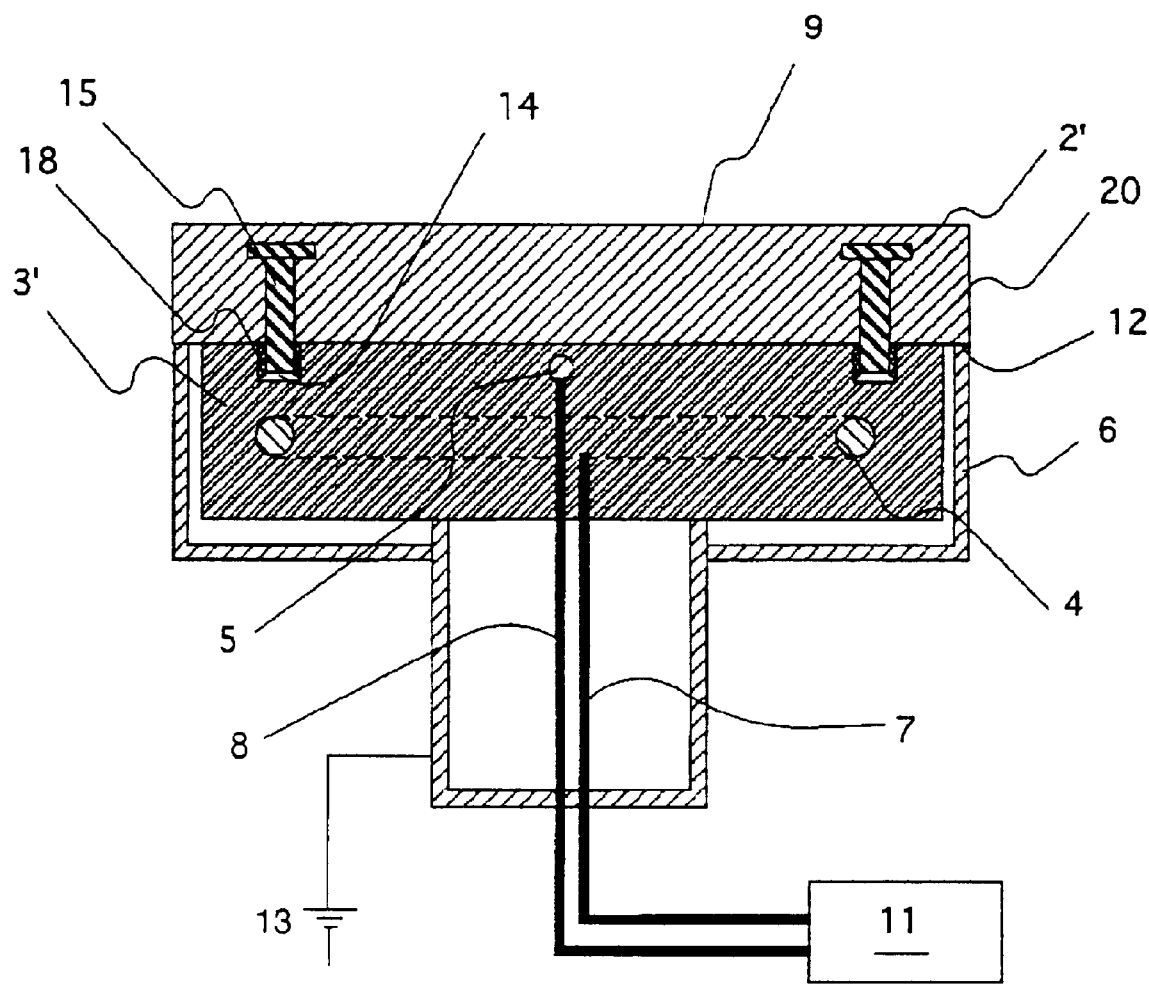
FIG. 3 is a sectional view of another embodiment of a substrate holding apparatus according to the present invention.

A second embodiment of the present invention will now be described. FIG. 3 schematically shows a sectional view of a second embodiment of a substrate holding apparatus according to the present invention. The parts identical to those in the preferred embodiment shown in FIG. 1 are indicated by the same reference numbers. The present embodiment is different from the preferred embodiment shown in FIG. 1 in that a mount plate 2' is fixed to a heating block 3' with bolts 15.

The bolts 15 are engaged with female screws 18 embedded in holes 14 in the heating block 3' to tightly fix together the mount plate 2' and the heating block 3'. Preferably, the tight fixing is achieved using at least two bolts provided at equal intervals in the vicinity of the circumferential edge of the mount plate 2'. The female screws 18 may be formed by directly threading the holes 14 in the heating block 3'. While the bolts 15 and female screws 18 are preferably made of inconel, other metals having anti-corrosion properties may be used.

A shield member 6 is welded to the circumferential edge of the bottom of the mount plate 2' using electron beams at its open end 12.

Figure 4:
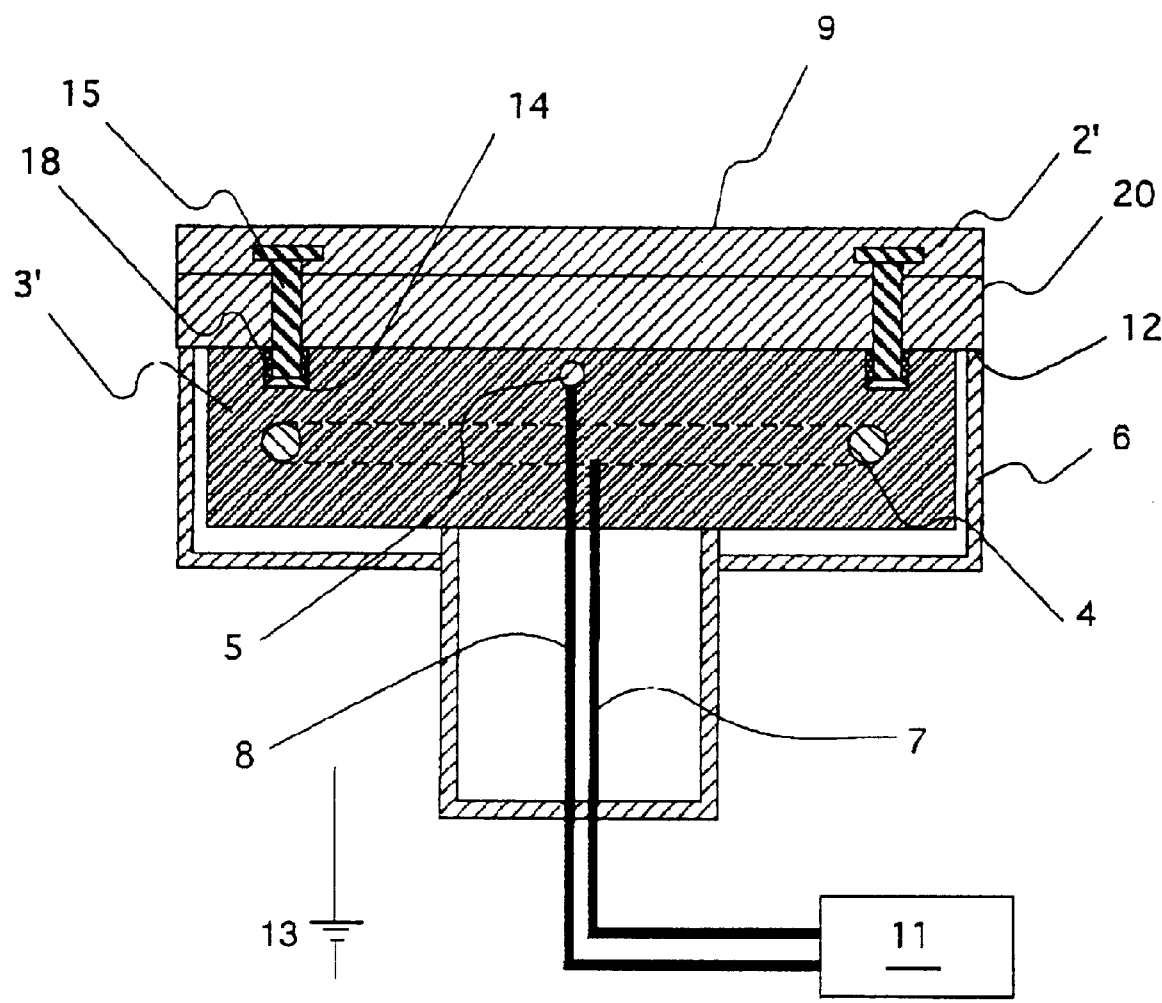
FIG. 4 is a sectional view of still another embodiment of a substrate holding apparatus according to the present invention.
Figure 5:
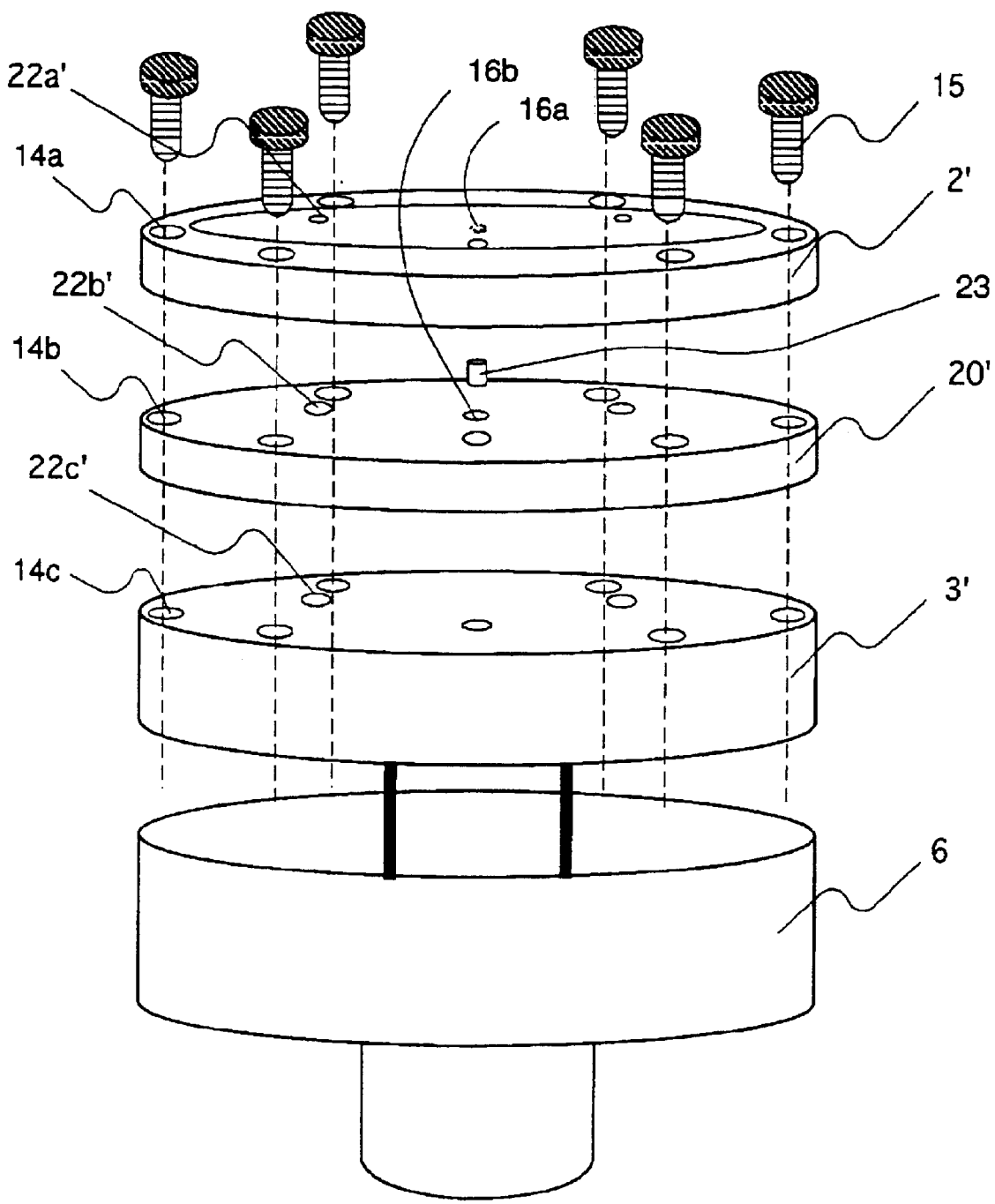
FIG. 5 is an exploded perspective view of the substrate holding apparatus in FIG. 4.

A third embodiment of the present invention will now be described. FIG. 4 schematically shows a sectional view of a third embodiment of a substrate holding apparatus according to the present invention. FIG. 5 is an exploded perspective view of the same. The present embodiment is different from the second embodiment shown in FIG. 3 in that an auxiliary plate 20 is inserted between a mount plate 2' and a heating block 3'.

Preferably, the auxiliary plate 20 is a disc-shaped body which is made of an aluminum alloy wrought products, substantially equal to the mount plate 2' in diameter and is 3 mm to 30 mm thick. Through holes 14a and 14b for inserting bolts 15 are provided at equal intervals on the mount plate 2' and auxiliary plate 20, respectively. The bolts 15 extend through the through holes 14a and 14b to be engaged with female screws 18 embedded in holes 14c in the heating block 3', thereby tightly fixing the mount plate 2', auxiliary plate 20 and heating block 3' together. The female screws 18 may be formed by directly threading the holes 14c in the heating block 3'.

Preferably, the bottom surface of the auxiliary plate 20 is tightly bonded to the top surface of the heating block 3' using a brazing process. In this case, the female screws 18 may be embedded in the through holes 14b of the auxiliary plate 20 to tightly fix only the mount plate 2' and auxiliary plate with the bolts 15. The through holes 14b of the auxiliary plate may be directly threaded to form female screws. While the bolts 15 and female screws 18 are preferably made of inconel, other metals having anti-corrosion properties may be used.

An open end 12 of a shield member 6 is bonded to the circumferential edge of the bottom of the auxiliary plate 20 using an electron beam welding process.

The through holes 14a, 14b and 14c are provided in at least two locations (preferably six locations) at equal intervals in the vicinity of each of the mount plate 2', auxiliary plate 20 and heating block 3'. Preferably, through holes 22a', 22b' and 22c' for inserting hold rods for picking up a semiconductor wafer are provided in three locations each on the mount plate 2', auxiliary plate 20 and heating block 3'. Further, nonthrough holes 16a and 16b for receiving locating pins 23 are provided on the bottom surface of the mount plate 2' and the top surface of the auxiliary plate 20.

Figure 6:
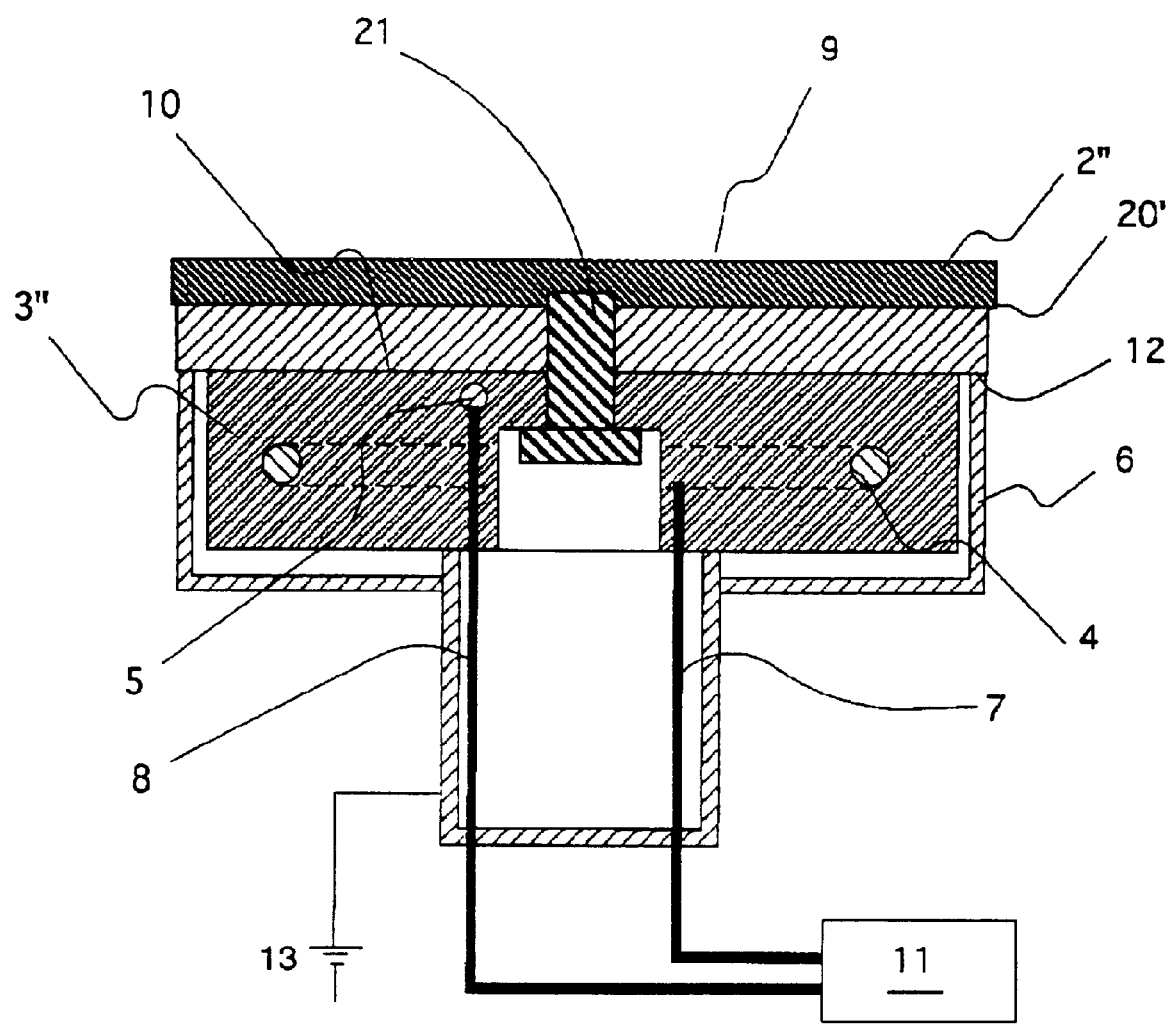
FIG. 6 is a sectional view of a further embodiment of a substrate holding apparatus according to the present invention.
Figure 7:
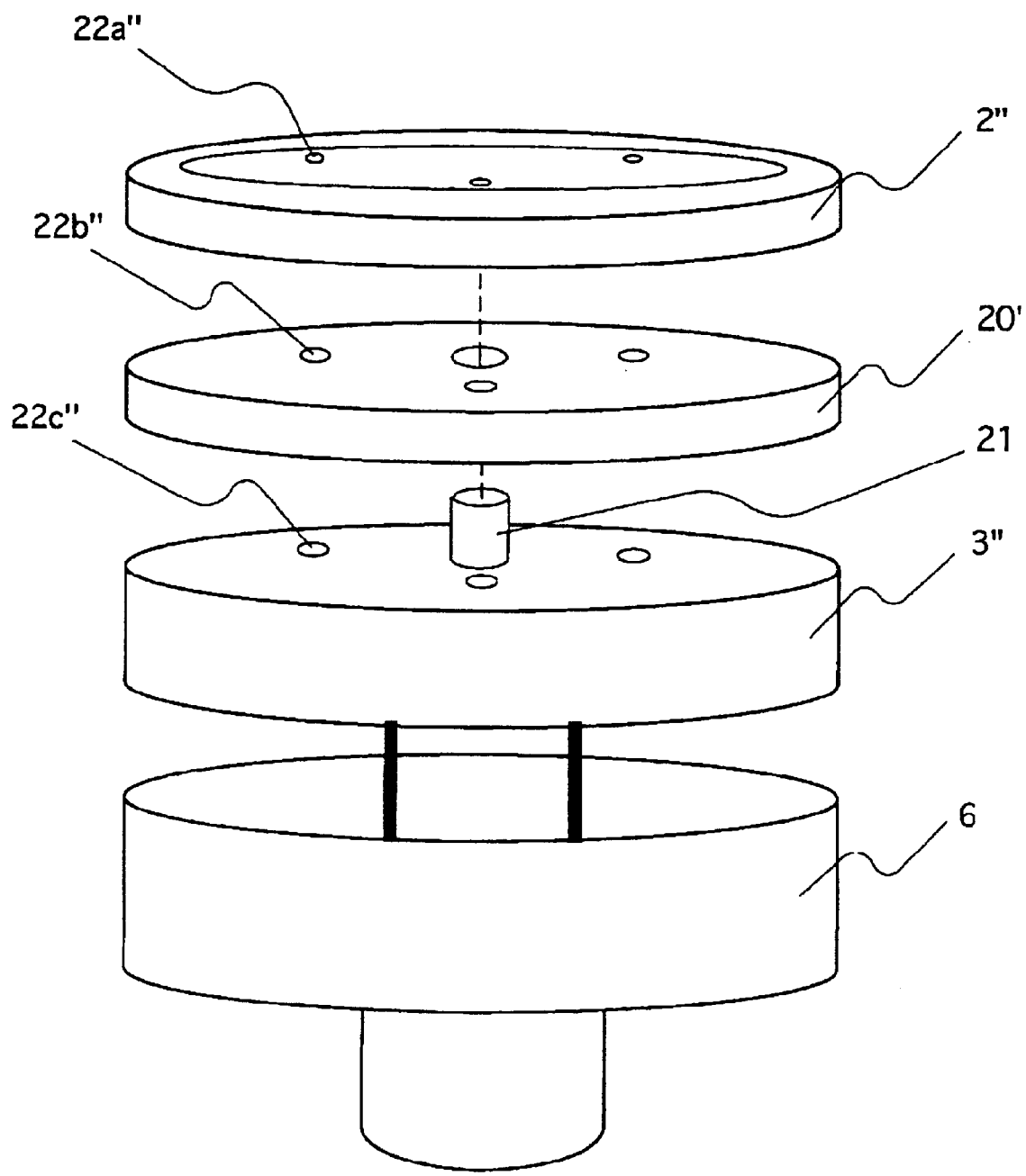
FIG. 7 is an exploded perspective view of the substrate holding apparatus in FIG. 6.

A fourth embodiment of the present invention will now be described. FIG. 6 schematically shows a sectional view of a fourth embodiment of a substrate holding apparatus according to the present invention, and FIG. 7 shows an exploded perspective view of the same. The present embodiment is different from the third embodiment in that an auxiliary plate 20' made of an aluminum wrought products is inserted under a mount plate 2" made of a ceramic material and in that a heating block 3", an auxiliary plate 20 and the mount plate 2" are fixed by a central bolt 21.

While the ceramic material for the mount plate 2" is preferably aluminum nitride, alumina ($Al_2O_3$) or magnesium oxide (MgO) may be used alternatively. Since the auxiliary plate 20 is made of an aluminum wrought products like that described above, its thermal expansion coefficient is greatly different from that of the mount plate 2" made of aluminum nitride. Therefore, cracks can occur due to distortions if they are fixed together using the above-described methods illustrated in FIGS. 1, 3 and 4. According to the present embodiment, they are fixed together using a bolt at their centers where distortion is small. Preferably, the bottom surface of the auxiliary plate 20 is brazed to the top surface of the heating block 3" at a bonding surface 10.

Since the surface of the aluminum wrought products has been very flatly finished, it may be attached to aluminum nitride more tightly than an aluminum alloy in the prior art. By fastening them with the bolt, they can be attached more tightly to ensure high thermal conductivity.

While the bolt 21 is preferably made of inconel, other metals having anti-corrosion properties may be used. According to the fourth embodiment, female screws are embedded in or directly threaded on each of the mount plate 2", auxiliary plate 20 and heating block 3" such that the bolt 21 may be moved from the heating block 3" toward the mount plate 2".

A shield member 6 is preferably welded to the circumferential edge of the bottom of the auxiliary plate 20 at its open end 12 using electron beams.

Preferably, through holes 22a", 22b" and 22c" for inserting hold rods for picking up a semiconductor wafer are provided in three locations each on the mount plate 2", auxiliary plate 20 and heating block 3" as described above.

By forming a surface for mounting a semiconductor substrate from an aluminum wrought products, a susceptor having high resistance to fluorine based active species can be provided to significantly reduce the risk of contamination by impurities.

Since the surface of a heating block is covered with an auxiliary plate made of an aluminum wrought products in tight contact therewith, high resistance to fluorine active species can be achieved and a process temperature during a process can be maintained stable.

Further, since a susceptor as a whole can be formed from aluminum, the manufacturing cost of an apparatus can be significantly reduced.

What is claimed is:

1. A substrate-holding apparatus for holding a semiconductor substrate inside a reactor, said apparatus comprising:
    a mount plate made of an aluminum alloy wrought product and having a mount surface for mounting a semiconductor substrate thereon and a bottom surface;
    a heating block with a heater body being embedded therein for heating said semiconductor substrate, said heating block being made of an aluminum alloy and having a top surface to which the bottom surface of the mount plate is securely attached by brazing or at least one bolt; and
    a shield member made of an aluminum alloy wrought product for housing and enclosing therein said heating block to prevent said heating block from being exposed to an interior of the reactor.

2. A substrate-holding apparatus for holding a semiconductor substrate inside a reactor, said apparatus comprising:
    a mount plate made of an aluminum alloy wrought product and having a mount surface for mounting a semiconductor substrate thereon and a bottom surface;
    a heating block with a heater body being embedded therein for heating said semiconductor substrate, said heating block being made of an aluminum alloy and having a top surface;
    an auxiliary plate made of an aluminum alloy wrought product interposed between said mount plate and said heating block, wherein the top surface and the bottom surface of the auxiliary plate are securely attached to the bottom surface of the mount plate and the top surface of the heating block, respectively, by brazing or at least one bolt; and
    a shield member made of an aluminum alloy wrought product for housing and enclosing therein said heating block to prevent said heating block from being exposed to an interior of the reactor.

3. The substrate holding apparatus as recited in claim 2, wherein said heating block is comprised of aluminum alloy.

4. The substrate-holding apparatus as recited in claim 2, wherein said tight attachment between the top surface of said auxiliary plate and the bottom of surface of said mount plate is achieved by fixing said auxiliary plate and said mount plate together by at least one bolt.

5. The substrate-holding apparatus as recited in claim 2, wherein said tight attachment between the bottom surface of said auxiliary plate and the top surface of surface of said heating block is achieved by brazing together the bottom surface of said auxiliary plate and the top surface of said heating block.

6. A substrate-holding apparatus for holding a semiconductor substrate inside a reactor, said apparatus comprising:

a mount plate made of an aluminum alloy wrought product and having a mount surface for mounting a semiconductor substrate thereon and a bottom surface;

a heating block with a heater body being embedded therein for heating said semiconductor substrate, said heating block being made of an aluminum alloy and having a top surface;

an auxiliary plate made of an aluminum alloy wrought product interposed between said mount plate and said heating block, wherein the top surface of the auxiliary plate is securely attached to the bottom surface of the mount plate by at least one bolt, and the bottom surface of the auxiliary plate is securely attached to the top surface of the heating block by brazing or at least one bolt; and a shield member made of an aluminum alloy wrought product for housing and enclosing therein said heating block to prevent said heating block from being exposed to an interior of the reactor.

7. The substrate-holding apparatus as recited in claim 6, wherein said ceramic material is one selected from the group consisting of aluminum nitride, alumina, and magnesium oxide.

8. The substrate-holding apparatus as recited in claim 6, wherein said tight attachment between the top surface of said auxiliary plate and the bottom surface of said mount plate is achieved by fixing together said auxiliary plate and said mount plate by using at least one bolt.

9. The substrate-holding apparatus as recited in claim 6, wherein said tight attachment between the bottom surface of said auxiliary plate and the top surface of said heating block is achieved by brazing together the bottom surface of said auxiliary plate and the top surface of said heating block.

10. The substrate-holding apparatus as recited in claim 1, wherein said tight attachment is achieved by brazing the bottom surface of said mount plate to the top surface of said heating block.

11. The substrate-holding apparatus as recited in claim 1, wherein said tight attachment is achieved by fixing said mount and said heating block together by at least one bolt.

12. The substrate-holding apparatus as recited in claim 3, wherein said tight attachment between the top surface of said auxiliary plate and the bottom of surface of said mount plate is achieved by fixing said auxiliary plate and said mount plate together by at least one bolt.

13. The substrate-holding apparatus as recited in claim 3, wherein said tight attachment between the bottom surface of said auxiliary plate and the top surface of surface of said heating block is achieved by brazing together the bottom surface of said auxiliary plate and the top surface of said heating block.

14. The substrate-holding apparatus as recited in claim 4, wherein said tight attachment between the bottom surface of said auxiliary plate and the top surface of surface of said heating block is achieved by brazing together the bottom surface of said auxiliary plate and the top surface of said heating block.

15. The substrate-holding apparatus as recited in claim 7, wherein said tight attachment between the top surface of said auxiliary plate and the bottom surface of said mount plate is achieved by fixing together said auxiliary plate and said mount plate by using at least one bolt.

16. The substrate-holding apparatus as recited in claim 7, wherein said tight attachment between the bottom surface of said auxiliary plate and the top surface of said heating block is achieved by brazing together the bottom surface of said auxiliary plate and the top surface of said heating block.

17. The substrate-holding apparatus as recited in claim 8, wherein said tight attachment between the bottom surface of said auxiliary plate and the top surface of said heating block is achieved by brazing together the bottom surface of said auxiliary plate and the top surface of said heating block.

* * * * *